United States Patent
Kaushik et al.

(10) Patent No.: US 7,134,057 B1
(45) Date of Patent: Nov. 7, 2006

(54) OFF-PITCH COLUMN REDUNDANCY USING DYNAMIC SHIFTERS

(75) Inventors: Pradeep Kaushik, Sunnyvale, CA (US); Dennis Wendell, Sunnyvale, CA (US); Suresh Seshadri, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 449 days.

(21) Appl. No.: 10/778,916

(22) Filed: Feb. 13, 2004

(51) Int. Cl.
*G01C 29/00* (2006.01)
(52) U.S. Cl. .................................. 714/711; 714/710
(58) Field of Classification Search .............. 365/200, 365/189.01; 714/5, 42, 711, 710, 718
See application file for complete search history.

(56) References Cited

U.S. PATENT DOCUMENTS

| | | | |
|---|---|---|---|
| 5,204,836 A | 4/1993 | Reed | 365/200 |
| 5,475,648 A | 12/1995 | Fujiwara | 365/230.06 |
| 5,491,664 A * | 2/1996 | Phelan | 365/200 |
| 5,537,665 A * | 7/1996 | Patel et al. | 714/5 |
| 5,548,553 A * | 8/1996 | Cooper et al. | 365/200 |
| 5,627,963 A * | 5/1997 | Gabillard et al. | 714/42 |
| 6,021,512 A * | 2/2000 | Lattimore et al. | 714/710 |
| 6,118,727 A | 9/2000 | Allan et al. | 365/230.06 |
| 6,226,713 B1 | 5/2001 | Mehrotra | 711/118 |
| 6,243,305 B1* | 6/2001 | Brady | 365/200 |
| 6,269,426 B1 | 7/2001 | Hetherington et al. | 711/140 |
| 6,272,056 B1* | 8/2001 | Ooishi | 365/200 |
| 6,407,950 B1* | 6/2002 | Ooishi | 365/189.01 |
| 6,992,937 B1* | 1/2006 | Tran et al. | 365/200 |
| 2001/0030893 A1 | 10/2001 | Terzioglu et al. | 365/200 |
| 2002/0056020 A1 | 5/2002 | Sartore et al. | 711/105 |

OTHER PUBLICATIONS

G. Konstadinidis et al., "Implementation of a Third-Generation 1.1GHz 64b Microprocessor," 2002 IEEE International Solid-State Circuits Conference, Session 20/Microprocessors/20.3.

G. Konstadinidis et al., "Implementation of a Third-Generation 1.1GHz 64b Microprocessor," 2002 IEEE Journal of Solid-State Circuits, vol. 37, No. 11, Nov. 2002, pp. 1461-1469.

R. Heald et al., "A Third-Generation SPARC V9 64-b Microprocessor," IEEE JSSC, Nov. 2000, pp. 1526-1538.

B. McCarroll et al., "A High-Speed CMOS Comparator for Use in an ADC," IEEE JSSC, Feb. 1988, pp. 159-165.

\* cited by examiner

*Primary Examiner*—David Ton
(74) *Attorney, Agent, or Firm*—Dorsey & Whitney LLP

(57) ABSTRACT

An apparatus and method for controlling and providing off-pitch shifting circuitry for implementing column redundancy in a multiple-array memory is described in connection with an on-board cache memory integrated with a microprocessor. Depending upon the particular sub-array being accessed, shift position data is provided to a shared, off-pitch shift circuit to control the read and/or write operations for the memory. A register bank stores data identifying the defective columns which is compared to the incoming address information to detect any matches. In response to a match, control information is provided to the off-pitch shift circuit for shifting or re-routing the incoming data to a non-defective address in the memory. In this way, defective columns located in different positions in each sub-array can be replaced by redundant paths, thereby repairing the cache and increasing the manufacturing yield of microprocessors with an on-board cache memory.

20 Claims, 3 Drawing Sheets

OFF-PITCH COLUMN REDUNDANCY USING DYNAMIC SHIFTERS

BACKGROUND OF THE INVENTION

1. Field of the Invention

The present invention relates generally to the field of fault tolerant memory devices. In one aspect, the present invention relates to a column redundancy method and system using off-pitch column shifting in connection with a semiconductor memory device.

2. Description of the Related Art

Computer systems are constructed of many components, typically including one or more processors that are connected to a motherboard for access to one or more memory devices, (such as RAM) and secondary storage devices (such as hard disks and optical discs). For example, FIG. 1 is a diagram illustrating a multiprocessor system 10 with multiple memories. Generally, a processor 1a connects to a system bus 12. Also connected to the system bus 12 is a memory (e.g., 14a). During processor operation, CPU 2 processes instructions and performs calculations. Data for the CPU operation is stored in and retrieved from memory using a memory controller 8 and cache memory, which holds recently or frequently used data or instructions for expedited retrieval by the CPU 2. Specifically, an L1 cache 4 connects to the CPU 2, followed by an L2 cache 6 connected to the L1 cache 4. The CPU 2 transfers information to the L2 cache 6 via the L1 cache 4. Memory devices (e.g., L1 cache 4, L2 cache 6, main memory 14a) in computer systems are used to store data and/or instructions, and are typically implemented in the form of integrated circuit chips. As memory size, density and complexity increase, there are more opportunities for physical and circuit defects in the constructed integrated circuits, which can lower the production yield of semiconductor devices.

Redundancy circuits are used to overcome such defects and thereby boost semiconductor yield. Various redundancy schemes have been developed to repair memories having faulty memory cells by replacing the column having the defect with a redundant column of the memory array while preserving the original addresses of the affected data paths. In general, once the location of a defective memory cell or cells is identified during testing, the column containing the defective cell(s) is effectively disabled so that it can no longer be addressed, and a spare column of memory cells physically located elsewhere on the chip is programmed to be accessed by the logical address that would have accessed the defective column. Typically, information identifying a defective element is stored in latches or fuses located on each column or row of data path, though this requires excessive space in the valuable memory array area.

As microprocessors become more and more sophisticated (such as with 32-bit or 64-bit data path processors), additional problems arise, particularly when such devices use memories having multiple arrays. For example, a single redundant set of arrays cannot compensate for a short defect between arrays belonging to two adjacent main memory arrays. Therefore, at least two sets of redundant arrays would be needed to correct such defects. Additionally, data transmissions along the redundant path can suffer a speed penalty due to the extra line length and the incidence of higher parasitic capacitance. In some instances, the input and output data path to the redundant element may be tripled in length (as compared to the primary storage element) for a wide-word computing device. Variable delays from data paths are highly undesirable in high-performance memory storage, as they force the performance of an entire memory array to be no better than that of the extended length path's performance. Finally, fuses must be laid out integrally to each set so as to be able to selectively disconnect sets in which defects exist.

Conventional redundancy solutions that address these issues are described in U.S. Pat. Nos. 5,537,665 and 5,204,836, which are hereby incorporated by reference in their entirety as if fully set forth herein. These references disclose using "on pitch" shift circuits to shift around defective memory elements. For large multi-array memories using such "on-pitch" shift circuits to shift around defective columns, the number of registers and shift circuits required to store and route redundancy information increases dramatically. In addition, an increase in the number of registers increases the tracks that need to be allocated for routing the wires carrying the redundant information. An increase in the register count creates other problems, including reduced array efficiency, reduced redundancy register yield and cosmic ray protection issues. Thus, there is a need for a scheme which minimizes register count while maintaining redundancy coverage. Further limitations and disadvantages of conventional systems will become apparent to one of skill in the art after reviewing the remainder of the present application with reference to the drawings and detailed description which follow.

SUMMARY OF THE INVENTION

Broadly speaking, the present invention is a method and apparatus provides an improvement in memory redundancy design by providing for off-pitch column shifting during data read and write operations to a memory array. In a selected embodiment, the shift position is dynamically updated every access cycle, based upon the block of the memory array being accessed. A shifter circuit located outside of the memory sub-blocks may be used to keep track of the bad addresses by comparing a read or write memory address to the bad address and deciding where to shift the address data to thereby implement an improved and efficient column redundancy scheme.

In accordance with various embodiments of the present invention, a method and apparatus provide an on-chip memory for integration on a microprocessor, where the memory uses one or more off-pitch dynamic shifter circuits to provide column redundancy for a plurality of sub-arrays. In particular, a primary memory address provided to an integrated memory array is evaluated against defective column indicator information. The indicator information, which may be retrieved from off-chip storage, is used to identify a location of any defective column in a sub-array of the integrated memory. If the primary address corresponds to a defective address or column, a redundancy address control signal is generated and applied to the off-pitch dynamic shifter circuit. Depending on which sub-array is being accessed by the primary memory address, the dynamic shifter circuit couples data associated with the primary memory address signal to an array column address signal in response to the redundancy address control signal so any defective column in the sub-array is avoided during any access to said memory array. In a selected embodiment, the dynamic shift circuit may be initialized with a first shift value if a defective portion of a first sub-array in the plurality of sub-arrays is addressed in a first access cycle, and may be initialized with a second shift value if a defective portion of a second sub-array in the plurality of sub-arrays is addressed in a second access cycle.

The objects, advantages and other novel features of the present invention will be apparent to those skilled in the art from the following detailed description when read in conjunction with the appended claims and accompanying drawings.

DETAILED DESCRIPTION

A method and apparatus for providing off-pitch column redundancy using dynamic shifters is described. While various details are set forth in the following description, it will be appreciated that the present invention may be practiced without these specific details. For example, selected aspects are shown in block diagram form, rather than in detail, in order to avoid obscuring the present invention. Some portions of the detailed descriptions provided herein are presented in terms of algorithms or operations on data within a computer memory. Such descriptions and representations are used by those skilled in the field of memory design to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that throughout the description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices. For purposes of providing an exemplary and not limiting description, it will be useful to describe the various aspects and embodiments of the invention herein in the context of a cache memory structure that is constructed with CMOS SRAM memory cells. However, the present invention is not limited to CMOS-based processes and may be used in connection with other categories of memory products, including without limitation, DRAM, ROM, PLA, flash and the like, whether integrated within a VLSI system, cache or non-cache, or a stand alone memory device.

Figure 1:
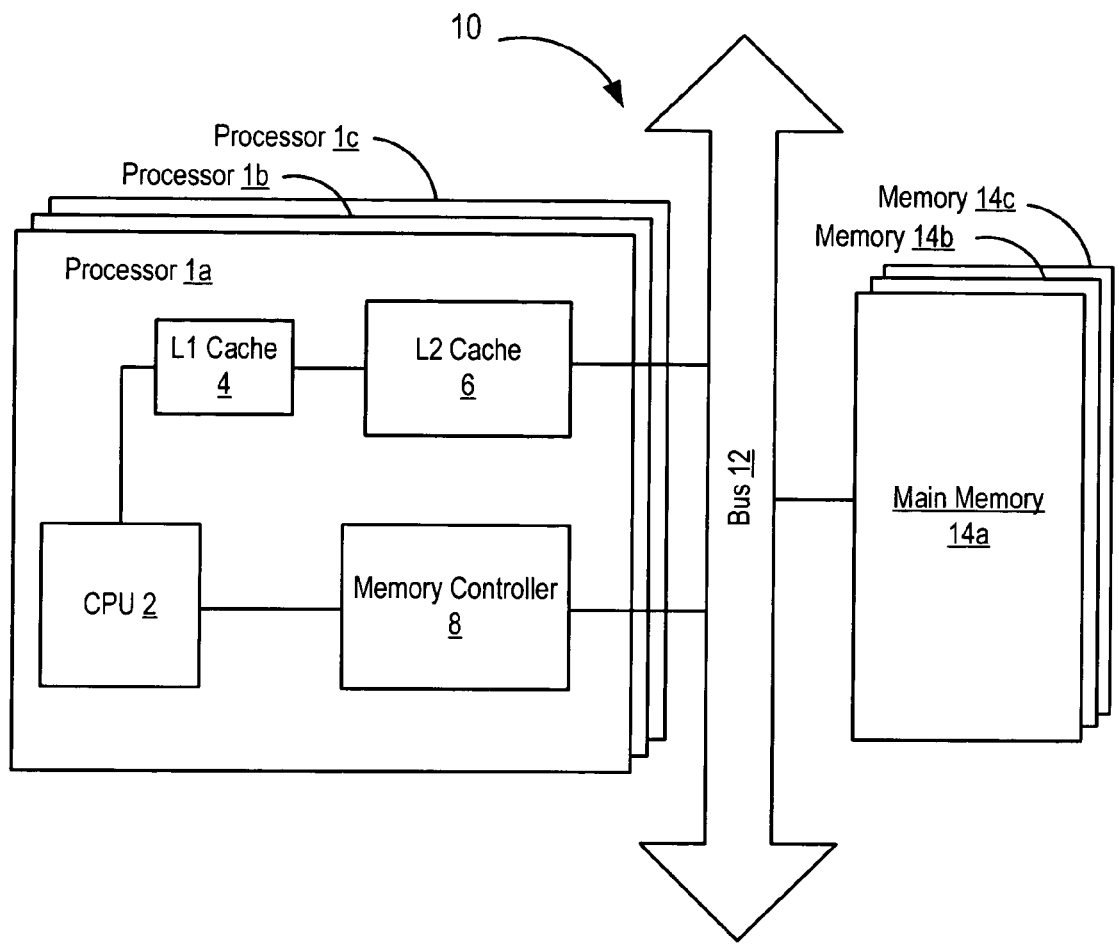
FIG. 1 is a block diagram of a computer system featuring exemplary memory devices.

In connection with the example described herein and depicted in FIG. 1, most computer systems 10 include one or more processors 1 with a central processing unit (CPU or ALU) 2 that uses a cache memory system 4, 6 to speed memory access and to overcome the delays imposed by accessing remote memory subsystems 14. Cache memory comprises one or more levels of dedicated high-speed memory holding recently accessed data, designed to speed up subsequent access to the same data. Cache technology is based on the premise that programs frequently re-execute the same instructions or re-use the same data. When data is read from main memory 14, a copy is also saved in the cache, along with an index to the associated main memory. The cache then monitors subsequent requests for data to see if the information needed has already been stored in the cache. If the data had indeed been stored in the cache (i.e., a "hit"), the data is delivered immediately to the CPU and the attempt to fetch the information from main memory is aborted (or not started). If, on the other hand, the data had not been previously stored in cache (i.e., a "miss"), then it is fetched directly from main memory 14 and also saved in the cache for future access. Typically, processors support multiple cache levels, most often two or three levels of cache. A level 1 cache (L1 cache 4) is usually an internal cache built onto the same monolithic integrated circuit (IC) as the CPU 2 itself. On-chip cache is the fastest (i.e., lowest latency) because it is accessed by the internal components of the processor. An additional level 2 cache (L2 cache 6) may also be integrated on chip with the CPU or may be an external cache of static random access memory (SRAM) chips plugged into a motherboard. Off-chip cache has much higher latency, although it is typically much shorter latency than accesses to main memory 14.

Figure 2:
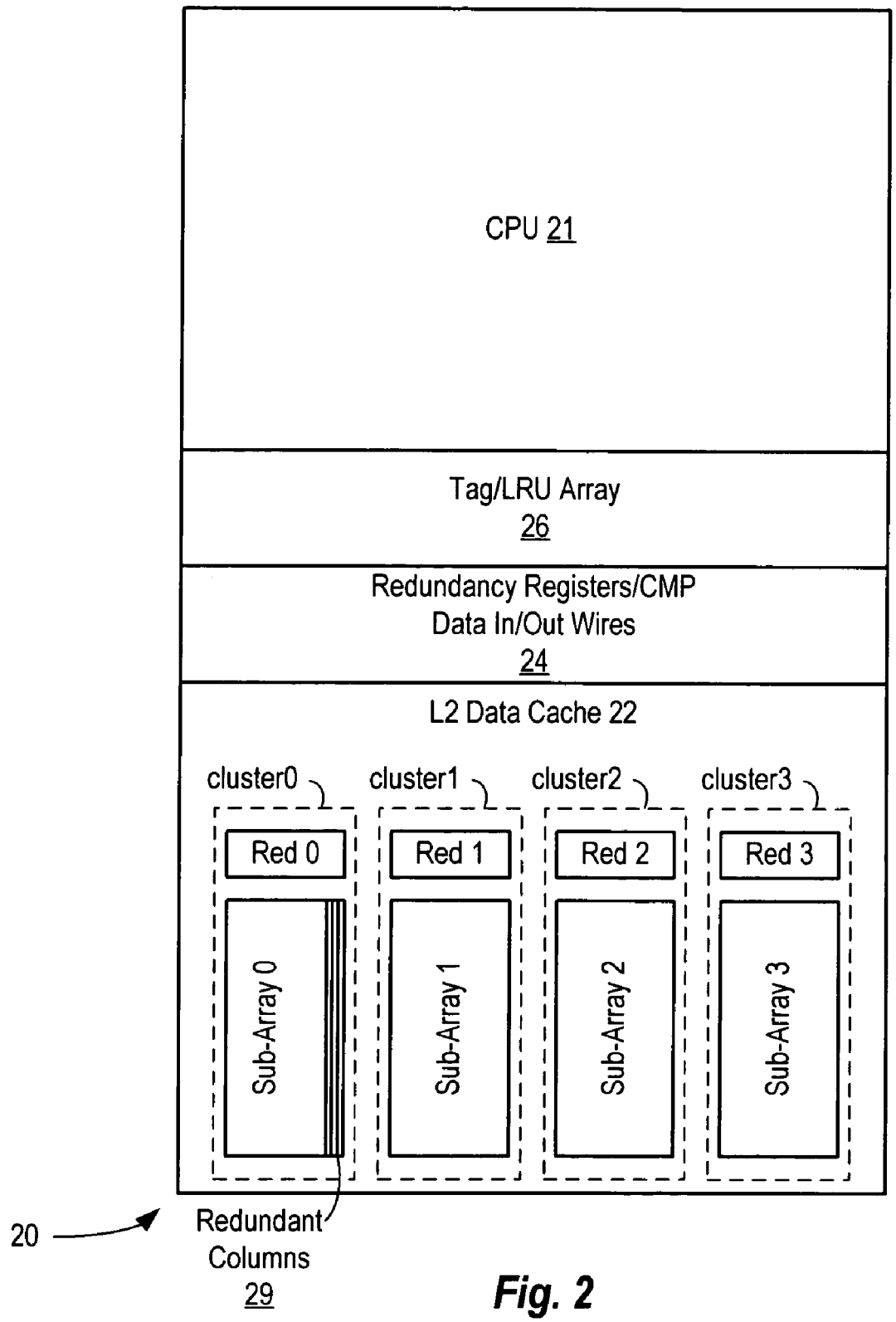
FIG. 2 illustrates the main functional blocks of a microprocessor system using the column redundancy system of the present invention.

As semiconductor memories become more and more dense and/or are integrated with other circuitry (such as the integration of CPU 2, L1 cache 4 and L2 cache 6), the overall circuit becomes more and more susceptible to the presence of defects which could impede or corrupt the flow of data through any of the desired paths. A specific example of such a complex integrated circuit system is shown in FIG. 2, which depicts the main functional blocks of a 90 nm technology, 64 bit, 1.6 GHz, four-instruction-issue SPARC (TM) RISC microprocessor 20 that supports one- to four-way high-end desktop workstations and workgroup servers. This microprocessor device includes a central processor unit (CPU) 21 that is integrated with a 4 MByte on-chip L2 cache 22. In the exemplary implementation depicted in FIG. 2, the 4 MByte L2 Data Cache 22 is organized as a four-way set associative memory, with 16,384 entries, a 64 Byte block size, and a 256 bit cache line size. The addressing uses 14 index bits, 19 tag bits, and 28 total tag bits per way after including ECC and coherence bits. The data array uses 9 bit/16 Byte ECC error correction bits. Data array latency/throughput is 8/2 clock cycles, while the Tag/LRU array latency/throughput is 3/1 for snoop operations and hit/miss signals. The cache is physically indexed and physically tagged, and implements an LRU (least recently used) line replacement algorithm that incorporates write-back and write-allocate. It is a write-back write-allocate cache supporting a modified-owned-exclusive-shared-invalid (MOESI) cache coherence protocol.

As depicted in FIG. 2, the cache array 22 may be organized into multiple clusters (cluster0, cluster1, cluster2 and cluster3), with each cluster including a sub-array (e.g., Sub-Array 0) and redundant array (e.g., Red 0) and/or redundant columns. Though FIG. 2 illustrates redundant arrays (e.g., Red 0) that are separately positioned at the periphery of the sub-arrays (such as might occur when providing row redundancy elements), redundant rows and/or columns may also be incorporated integrally within the sub-array, such as illustrated with the Redundant Columns 29 that are physically located adjacent to the primary sub-array columns (e.g., Sub-Array 0). The collection of sub-arrays and/or redundant arrays may be referred to as the main memory array or "pitch," to borrow an expression from the sporting vernacular.

Access to the cache 22 is provided through the cache control circuit (which may be implemented in the CPU portion 21), tag/LRU array 26 and redundancy control circuit 24. Thus, access control circuitry may be physically separate from the memory array, though formed on the integrated circuit substrate for the microprocessor 20. As described herein, the access control circuit uses a dynamic shift circuit that is shared by the sub-arrays in a particular cluster (e.g., cluster0). In accordance with the present invention, the shift circuit may be implemented as a combinatorial collection of multiplexers or other connector circuit(s) that may be dynamically configured with each memory access to its associated array so that input or output data is stored or retrieved from non-defective memory elements based on the redundancy defect data associated with the accessed array.

For each of the sub-arrays or sections in a cluster, if and when the primary memory address (or portion thereof) includes a defective column in the cluster, the dynamic shifter adjusts an incoming primary memory address (or portion thereof) to a non-defective column, which may be in the sub-array or in the redundant column array (e.g., Redundancy Columns). In one embodiment, the redundancy control circuit 24 determines if the primary memory address includes a defective address or element by comparing the primary memory address to redundancy data that is stored in redundancy registers. The redundancy data, which may be remotely stored (for example, by using off-pitch fuses), is locally stored in the redundancy registers and identifies defective elements in the primary memory space (e.g., defective columns in a sub-array or section). A plurality of comparison circuits may be used to determine if the incoming primary address matches with any of the defective memory elements identified by the redundancy data. Depending on the match results, the dynamic shifter circuit for a cluster is initialized with control data to route at least part of the primary memory address to an alternate memory location, such as a redundant element in the same cluster.

Figure 3:
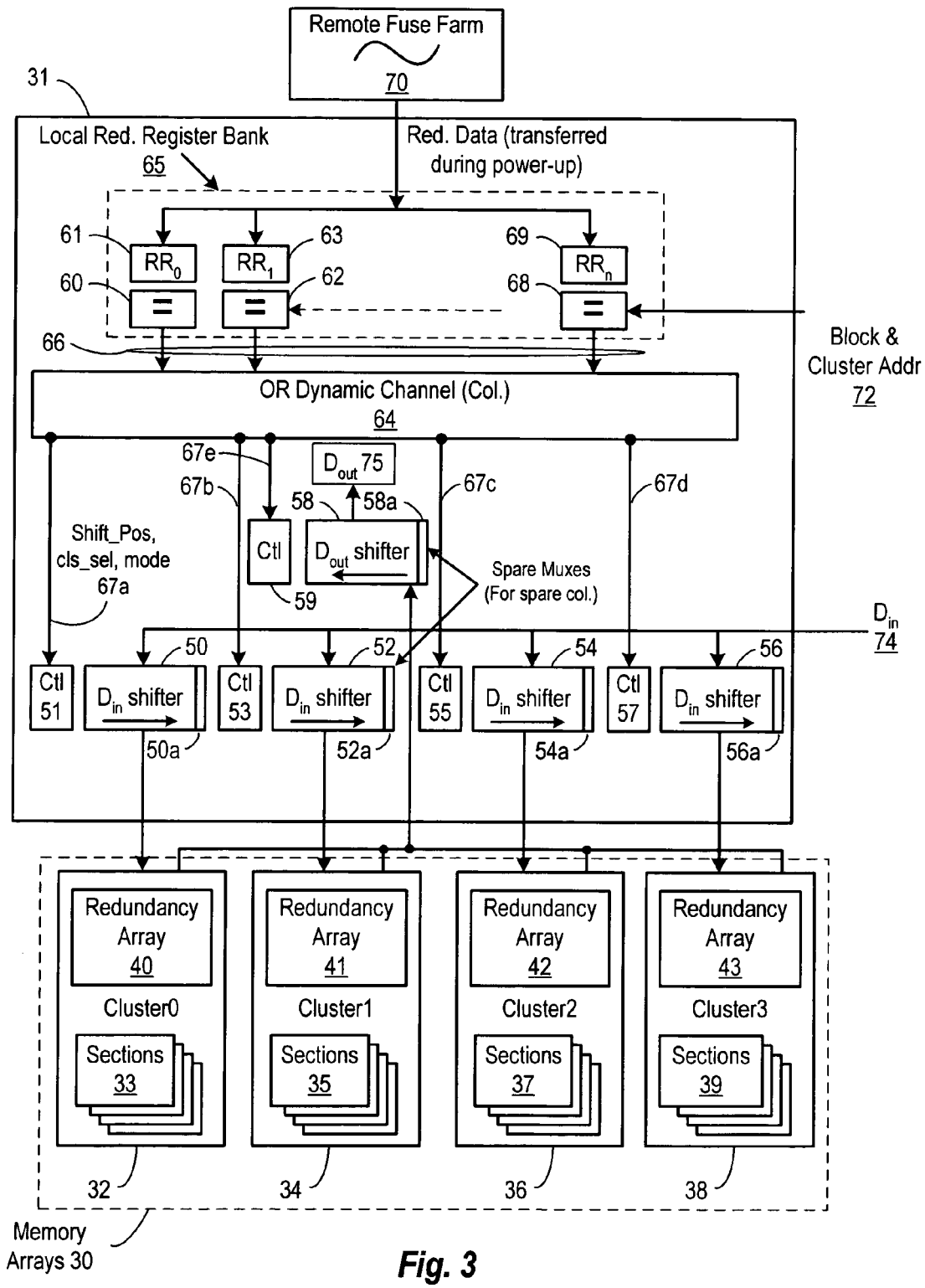
FIG. 3 illustrates additional details of a cache array redundancy embodiment of the present invention.

FIG. 3 illustrates additional details of an embodiment of the redundancy scheme of the present invention implemented in connection with a memory array 30. Each cluster (e.g., 32) in the array includes a sub-array that is divided into multiple sub-blocks or sections (e.g., 33) and column-redundant elements for a way (column) group of four bitlines (e.g., 40). While the redundant elements (e.g., 40) are shown in FIG. 3 as being a separate array, it will be appreciated that redundant elements, such as redundant columns, may be positioned at the periphery of each sub-array (e.g., 33), as illustrated in FIG. 2 with reference to the Redundant Columns 29. To determine if a redundant column (or columns) will be used in connection with a memory access request specified by a primary memory address, comparison blocks 60, 62, etc. are used to select the element to be repaired using column redundancy elements by comparing primary address information 72 with data from the remotely located fuses 70 stored in soft registers 61, 63, etc. in the local redundancy register bank 65.

When the comparison circuits determine that an incoming memory address 72 matches a defective address identified by the information stored in local redundancy register bank 65, the defective address is avoided using the shift circuits located in the peripheral data I/O circuit area 31 and implemented as data-in and out shifters 50, 52, 54, 56, 58. Each of these off-pitch shifters is shared by sub-arrays in a given cluster, and is used to route the incoming data 74 to new, shifted locations in the sub-array and/or redundancy array, as required. Instead of using switch circuits incorporated in the array 30, the present invention accrues a number of advantages from moving the data shifters off-pitch or outside the array 30, including simplified pitched cells, improved array efficiency and less space constrained layout.

In accordance with the present invention, the off-pitch shifter circuits are used to switch the arrays of parallel data paths in memory data structures upon the detection of defects in the data path or memory storage device implicated by the primary memory address 72. In particular, redundant parallel arrays are used to correct for any open or short defects in a parallel memory data structure using the dynamic shift circuits 50, 52, 54, 56, 58 as toggle switches or shifter circuits. Upon encountering any open or short in the one or more data paths (as identified by control information provide to the toggle switch), the toggle switches coupled to the data paths affected by the open or short are "flipped" to connect to the adjacent data paths in a cascading fashion. For example, during memory write operations, if an address 72 for the memory storage location corresponds to a defective column (for example) identified by the redundant data from the fuse farm 70, the local redundancy register bank 65 generates a defect signal output 66. In a selected embodiment, the defect signal 66 is generated using comparison circuits (60, 62, 68, etc.) which receive the incoming address information 72 and simultaneously compare it to defective address information stored in redundancy registers (61, 63, 69, etc.). By storing data from the remotely located fuses in soft redundancy registers, (61, 63, 69, etc.), both row redundancy and column redundancy may be flexibly and efficiently provided with fewer registers and a more efficient circuit layout. In one embodiment, the bank of redundancy registers 65 requires only enough registers for the total number of repairs, and these registers can be shared over the array clusters by using a dynamic channel allocation circuit 64.

Upon receiving the defect signal 66, the dynamic channel circuit 64 issues a shift control signal and/or redundant address control signal 67 to the input data shifter circuit corresponding to the particular section of the array being addressed. For a column redundancy scheme, one or more dynamic channel circuits are provided for replacing defective columns. The dynamic channel circuit 64 provides control information 67 specifying, for example, the shift position, column select and mode to a shifter control circuit (e.g., 51) for the dynamic shifter (e.g., 50) corresponding to the specific memory section (e.g., within section 33 of cluster 32) being addressed for the write operation. The "mode" control information is used by the shifter to distinguish between normal I/O column repair and a wire repair when four adjacent I/O columns are replaced, described more fully below.

The dynamic shifter circuits may be constructed in any suitable fashion to implement the address routing function of the present invention. For example and as illustrated in FIG. 3, each shifter circuit may be constructed of a plurality of multiplexers (muxes), each of which operates under control of a select line provided by the associated control circuit to pass data to and from the memory array 30. Spare multiplexers (50a, 52a, 54a, 56a, 58a) may be provided in each shifter for connecting the redundant elements to the data ports 74, 75, again under control of select lines provided by the control circuit.

Once the dynamic shifter (e.g., 50) corresponding to the cluster (e.g., 32) containing the memory write address (e.g., identifying a sub-block in section 33) receives control information from its shifter control circuit (e.g., 51), the shifter is initialized with a shift pattern. For example, if one or more of the primary data paths in an array section (e.g., 33) is defective, the shifter is initialized with a shift pattern which causes the shifters to shift around the defective primary data paths, thereby supplementing the non-defective primary data paths with redundant data paths when elements within the array section 33 are accessed. In order to maintain substantially uniform access paths to the memory elements, the shifters do not simply replace one of the defective primary data paths with one of the redundant data paths. Instead, the data paths are shifted so that the defective primary data path is replaced with an adjacent non-defective primary data path. Each of the subsequent primary data paths are replaced by their adjacent primary data path until the final primary data path is replaced by a redundant data path which is adjacent to it. With such shift patterns applied to a dynamic off-pitch shifter, incoming data 74 to be written into the memory array 30 is routed around any defective columns in the originally addressed memory space by the dynamic input shifters (50, 52, 53, 56).

A memory read access operates in substantially the same way to generate output data 75. An incoming address 72 for the data to be read from a particular section in the memory array 30 is compared to the redundancy data stored in the register bank 65. If there is a match, control information 67e is provided to the control circuit 59 for the dynamic output shifter 58 which uses the information to generate the select signals for the mux-based output shifter to shift the outgoing data to its correct position, including selection of the spare multiplexers 58a if the primary memory read address implicates a defective address, in which case the data stored in the redundant element is routed through multiplexers 58a to the data output port 75.

Other replacement mechanisms may also be used in connection with the present invention. For example, the dynamic shifters may be initialized with shift data that replaces only the defective primary data path(s) with redundant data path(s), thereby routing incoming data 74 such that only the portion of the incoming data that is addressed to a defective column is shifted to the redundant array.

Once initialized, the shifter retains the shift pattern until power is removed, until the shifter has been reinitialized by its corresponding shifter control circuit, or until the shifter is reset. In a selected embodiment, the shifter is in its default state prior to initialization whereby the primary data paths for the array section are used to access elements within that array.

In accordance with the present invention, redundant columns of a cluster (e.g., 32) can repair any location in the section of sub-blocks (e.g., 33) in that cluster. In addition, different shift patterns can be provided by a dynamic shifter at each memory access by loading custom shift data, depending on which sub-array or section in the cluster for the shifter is being addressed. This flexibility of replacement is made possible by having a single dynamic input shifter (e.g., 50) for that cluster which is dynamically initialized with control signal information provided by the dynamic channel allocation circuit 64.

In accordance with an alternate embodiment of the present invention, column redundant elements from different clusters can be aggregated, thereby allowing the repair of multiple consecutive I/O columns in a single cluster, and all respective control signal metal layers. By using redundant columns in adjacent sub-arrays, cosmic ray double bit hit reliability may be improved. This implementation is advantageously applied with large caches having numerous sub-arrays in the cache where the yield of global wires needs to be accounted for while designing redundancy schemes. For example, where a column select wire is used by multiplying I/O column slices, a defective column select wire would require replacing all affected I/O columns with spare I/O columns. In addition, a defect in the global wire would require replacing corresponding I/O columns in all sub-blocks over the entire cluster. Such a repair is facilitated by the off-pitch column redundancy scheme described herein.

Referring again to FIG. 3, the entire memory array 30 may be divided into four clusters 32, 34, 36, 38, with each cluster being divided into thirty-two vertically stacked sub-blocks. During any given memory access (read or write), a sub-block in one of the four clusters is selected by the address information 72. With the off-pitch column redundancy scheme of the present invention, shifters are placed outside the memory arrays or pitch area. As depicted, all, sub-blocks (e.g., 35) in a given memory cluster (e.g., 34) share the same shifter (e.g., 52). By sharing the shifter, less silicon real estate is required since fewer shifters are required. In addition, less redundancy decode circuitry is required by using a shared shifter. Another benefit of this scheme is that fewer redundancy registers are required than if each sub-block included its own redundancy register. Instead, with the present invention, a register bank 65 includes only enough redundancy registers (61, 63, etc.) based on the total number of repairs required. As illustrated, the bank of redundancy registers are shared by the clusters 32, 34, 36, 38 using a dynamic channel allocation circuit 64. By sharing the redundancy registers in the register bank 65, less routing track circuitry is required since the redundancy data need not be shipped to different parts of the array. For a large cache, the present invention provides a significant savings in routing tracks.

In accordance with a selected embodiment of the dynamic shifting scheme of the present invention, the off-pitch shifters (50, 52, 54, 56, 58) may be configured to shift different amounts, depending on which sub-block is being accessed. For example, if, in cluster 32, column 20 in sub-block0 and column 40 in sub-block 15 need to be repaired, different shift positions are transferred to the shifter 50 by the shift control circuit 51, depending on the sub-block being accessed. As a result, during any given access, the incoming block (or sub-block) and cluster addresses 72 are compared with all the redundancy registers 61, 63, etc. to determine if there is a match. A match indicates that there is a defective column in the accessed sub-block, and the associated shift position is transferred to the shifter control via a dynamic channel. In case of a memory write operation, the shifter control uses this information to generate the selects for the mux-based shifter. During a read operation, the associated shift information is used by the output data shifter 58 for the same purpose.

In accordance with a selected embodiment, the methods and systems for providing off-pitch column redundancy using dynamic shifters as shown and described herein may be implemented in software stored on a computer-readable medium and executed as a computer program on a general purpose or special purpose computer. The invention, for example, can be implemented in connection with any program that is used to control the operation and addressing of an integrated circuit memory, such as a microprocessor circuit. The invention can also be embodied as computer readable code on a computer readable medium. The computer readable medium is any data storage device that can store data, which can be thereafter be read by a computer system. For clarity, only those aspects of the software germane to the invention are described, and product details well known in the art are omitted. For the same reason, the computer hardware is not described in further detail. It should thus be understood that the invention is not limited to any specific computer language, program, or computer.

Thus, the present invention implements an off-pitch data shifter for use in providing column redundancy. The shift-position may be dynamically updated every access cycle, based upon the block of the memory array being accessed. An example application would be in a microprocessor having on-board cache memory comprised of more than one memory cluster. The present invention controls the address shift operation with a reduced number of redundancy registers and shifter circuits. The present invention also enables wire redundancy, which reduces the amount of required wiring and thereby improves device yield. In addition, the address shifting embodiment of the present invention provides better timing control. When the shared, off-pitch shifter is implemented to provide element redundancy, the present invention improves array efficiency, improves area utilization, and reduced the overall design time. As but one example of the benefits that may accrue from the various embodiments of the present invention described herein, the semiconductor yield rate may be improved for complex integrated circuits that require increasing complexity in design and miniaturizations, such as microprocessors which contain large on-board cache memory.

While the present invention has been particularly described with reference to FIGS. 1–3 and with emphasis on certain memory structures, it should be understood that the figures are for illustration purposes only and should not be taken as limitations upon the present invention. In addition, it is clear that the method and apparatus of the present invention has utility in any application where redundancy in memory structures or other circuit structures are desired. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A microprocessor system comprising:
    a central processing unit;
    an integrated memory array coupled to the central processing unit and addressable by a primary memory address, said memory array comprising a plurality of sub-arrays and a corresponding plurality of redundant columns,
    an integrated redundancy control circuit coupled to and physically separate from the memory array, comprising a dynamic shift circuit coupled to and shared by the plurality of sub-arrays for shifting at least a portion of a primary memory address to address at least one of the corresponding plurality of redundant columns when said primary memory address includes a defective address in a sub-array.

2. The microprocessor system of claim 1, wherein said dynamic shift circuit is initialized with a first shift value if a defective portion of a first sub-array in the plurality of sub-arrays is addressed in a first access cycle, and wherein said dynamic shift circuit is initialized with a second shift value if a defective portion of a second sub-array in the plurality of sub-arrays is addressed in a second access cycle.

3. The microprocessor system of claim 1, wherein the dynamic shift circuit is physically located outside the integrated memory array and is configured to be selectively coupled to any of the plurality of sub-arrays during any memory access to said sub-array.

4. The microprocessor system of claim 1, wherein the plurality of redundancy arrays comprises a first plurality of redundant columns that are physically located adjacent to a corresponding sub-array.

5. The microprocessor system of claim 1, comprising a second dynamic shift circuit coupled to and shared by a second plurality of sub-arrays in said integrated memory array, where each of said dynamic shift circuits may be separately configured to shift primary memory addresses based upon any defects contained within the sub-array being addressed.

6. The microprocessor system of claim 1, wherein dynamic shift circuit comprises a plurality of multiplexers.

7. The microprocessor system of claim 1, wherein redundancy control circuit comprises a redundancy register bank for holding redundancy data and comparing said redundancy data to the primary memory address.

8. The microprocessor system of claim 7, said redundancy register bank comprising a redundancy register for each defective column in the plurality of sub-arrays.

9. The microprocessor system of claim 1, where the integrated redundancy control circuit updates the dynamic shift circuit with control information each memory access cycle to provide column shifting if a primary memory address is associated with a defective address in one of said plurality of sub-arrays.

10. A fault-tolerant integrated memory circuit formed on semiconductor substrate, comprising:
    a memory array formed on said substrate comprising a plurality of memory clusters, each cluster having a set of memory banks, each memory bank having a set of N primary columns and M redundant columns, where "N" and "M" are predetermined whole numbers and where the primary columns and redundant columns may be addressed with array column address signals; and
    an off-pitch column redundancy control circuit formed on said substrate adjacent to said memory array, comprising:
        a storage circuit for holding defective column indicator information representing a location of any defective column in a memory bank;
        a comparison circuit coupled to receive defective column indicator information from the storage circuit and configured to compare, for each memory array access, defective column indicator information with a primary memory address signal received by said memory array and to generate a redundancy address control signal if the primary memory address signal includes a defective column;
        for each cluster, a shifter circuit physically located outside the memory array, each said shifter circuit being selectively coupled to each memory bank in said cluster depending on which memory bank is being accessed by said primary memory address, said shifter circuit coupling data associated with the primary memory address signal to an array column address signal in response to the redundancy address control signal so any defective column in the memory array is avoided during any memory access to said memory array.

11. The integrated memory circuit of claim 10, wherein the comparison circuit is configured to generate a first set of address shift control signals based on the defective column indicator information and to transmit said first set of address shift control signals to the shifter circuit corresponding to the cluster that is addressed by the primary memory address signal.

12. The integrated memory circuit of claim 10, wherein the array column address signal is an unshifted version of the primary memory address signal if the defective column indicator information indicates that the primary memory address signal does not include a defective column.

13. The integrated memory circuit of claim 10, wherein the array column address signal is a shifted version of the primary memory address signal if the defective column indicator information indicates that the primary memory address signal includes a defective column.

14. The integrated memory circuit of claim 10, wherein the storage circuit comprises a register bank for storing defective column indicator information retrieved from an off-chip fuse farm.

15. The integrated memory circuit of claim 10, wherein each shifter circuit comprises a set of N multiplexers for connecting data to or from the primary columns and a set of M multiplexers for connecting data to or from the redundant columns, where selection for said multiplexers is controlled in response to the redundancy address control signal.

16. The integrated memory circuit of claim 10, wherein the shifter circuit comprises an output shifter circuit that is coupled to receive data from each cluster and to shift the data into column positions that match the primary memory address signal, thereby preventing the retrieval of data from defective columns in the memory array.

17. The integrated memory circuit of claim 10, wherein the shifter circuit comprises an input shifter circuit that is coupled to receive input data and to shift the data from column positions that match the primary memory address to avoid writing data to defective columns in the memory array.

18. The integrated memory circuit of claim 17, wherein the shifter circuit comprises an input shifter circuit that is coupled to receive input data and to shift the data in response to a redundancy address control signal from column positions that match the primary memory address to avoid writing data to defective columns in the memory array.

19. In an integrated circuit memory circuit comprising a memory array comprising a first plurality of memory sub-arrays and a second plurality of memory sub-arrays, where each sub-array comprises redundant column elements, a method for providing off-pitch column redundancy, comprising:

storing defect data in a plurality of redundancy registers identifying defective columns in the memory array;

comparing the defect data to a memory array address to generate a select signal that identifies any defective column relating to the memory array address; and using a shift circuit that is shared by the first plurality of memory sub-arrays and that is located outside of the memory array to repair any location in the first plurality of memory sub-arrays with one or more column redundant elements.

20. The method of claim 19, further comprising using a shift circuit that is shared by the second plurality of memory sub-arrays and that is located outside of the memory array to aggregate redundant column elements from the first plurality of memory sub-arrays and a second plurality of memory sub-arrays to repair consecutive columns in a sub-array.

* * * * *